(12) United States Patent
Sinclair

(10) Patent No.: US 6,345,367 B1
(45) Date of Patent: Feb. 5, 2002

(54) DEFECTIVE MEMORY BLOCK HANDLING SYSTEM BY ADDRESSING A GROUP OF MEMORY BLOCKS FOR ERASURE AND CHANGING THE CONTENT THEREWITH

(75) Inventor: Alan Welsh Sinclair, Edinburgh (GB)

(73) Assignee: Memory Corporation PLC (GB)

( * ) Notice: Subject to any disclaimer, the term of this patent is extended or adjusted under 35 U.S.C. 154(b) by 0 days.

(21) Appl. No.: 09/214,726

(22) PCT Filed: Jul. 1, 1997

(86) PCT No.: PCT/GB97/01768

§ 371 Date: Feb. 16, 1999

§ 102(e) Date: Feb. 16, 1999

(87) PCT Pub. No.: WO98/02816

PCT Pub. Date: Jan. 22, 1998

(30) Foreign Application Priority Data

Jul. 11, 1996 (GB) ................................................ 9614551

(51) Int. Cl.$^7$ .......................... G06F 11/20; G11G 29/00; G11G 11/56
(52) U.S. Cl. .......................... 714/7; 711/100; 711/114; 711/208; 714/711; 714/718
(58) Field of Search ................................ 711/100, 114, 711/208; 714/7, 711, 718

(56) References Cited

U.S. PATENT DOCUMENTS 5,327,383 A * 7/1994 Merchant et al. ...... 365/185.24
5,438,573 A * 8/1995 Mangan et al. ............. 714/711

FOREIGN PATENT DOCUMENTS

| EP | 0 424 191 A2 | * | 4/1991 | |
| EP | 0 617 363 A2 | * | 9/1994 | |
| EP | 0 685 852 A2 | * | 12/1995 | |
| EP | 0 686 979 A1 | | 12/1995 | ........... G11C/29/00 |

* cited by examiner

Primary Examiner—Thomas Lee
Assistant Examiner—Tammara Peyton
(74) Attorney, Agent, or Firm—Gifford, Krass, Groh, Sprinkle, Anderson & Citkowski, P.C.

(57) ABSTRACT

A fault tolerant memory system includes an array of block-erasable storage elements (12). Each block (12) of storage locations is sub-divided into sub-groups (14) of storage elements. A control information store means holds defect information for each group in each block and an address counter holds the addresses of the groups in the particular erase block being erased. A testing circuit checks whether the defect information stored in the control information store for the particular group currently addressed by the address counter indicates that the particular group contains one or more defective storage locations. If it does it increments the address counter.

9 Claims, 1 Drawing Sheet

DEFECTIVE MEMORY BLOCK HANDLING SYSTEM BY ADDRESSING A GROUP OF MEMORY BLOCKS FOR ERASURE AND CHANGING THE CONTENT THEREWITH

FIELD OF THE INVENTION

The present invention relates to memory systems for digital computers and the like, and, in particular, to the field of block-structured memory systems in which individual memory elements cannot be erased individually.

DESCRIPTION OF THE RELEVANT PRIOR

Many memory systems have a requirement for non-volatile data storage with in-system write capability. FLASH EPROM semiconductor memory devices are frequently used for such applications.

A FLASH memory device is partitioned internally into independent blocks, each of which forms a set of storage locations which are erasable in a single operation. These independent blocks are called erase blocks. An erase block, therefore, is the smallest unit which can be erased in a single erase operation.

High capacity FLASH memory circuits, for example a 16 Mbit device, incorporate a high level of integration of the control operations on the memory itself. This enables the FLASH circuit to perform a number of tasks. For example, erasure of an erase block within the FLASH circuit is normally controlled by an internal state machine which is initiated by an erase command at an external interface.

The erase operation defined by the internal state machine is used to remove all charge from the floating gate electrode within each memory cell in the erase block through the mechanism of charge tunnelling. Over-erasure of a cell may result in damage to the cell or cells involved. To avoid the possibility of cell damage due to over-erasure all of the cells in the FLASH EPROM are first pre-conditioned. Pre-conditioning is the name given to a process for writing each cell in the particular erase block that is being erased to the charged state. Once all of the cells in an erase block have been pre-conditioned then an erase pulse of typical duration 10 milliseconds is applied to all of the cells in the erase block simultaneously. Full erasure of a cell requires the application of several erase pulses to the cell. The number of erase pulses required to erase a cell varies between cells in the erase block.

After each erase pulse is applied each cell in the erase block is read in turn to check if the particular cell being read has reached the erase condition. An internal address counter controls the checking operation (the operation where each cell is checked to determine whether or not it is in the erased condition) for each cell in the erase block.

This erase verification operation is performed with certain internal voltage and current reference signals set to levels which guarantee an adequate margin for a normal read operation. These reference signals set the control voltage used to access a cell being verified and the threshold current against which the cell current is compared. Values are used which ensure that current conducted by a cell during access after erasure is sufficiently offset from the threshold value applied during a normal read operation to guarantee an adequate safety margin for normal operation.

If any location is detected in the unerased state, the verification process is halted and a further erase pulse is applied. This process continues until either all of the cells are verified as being correctly erased or until the operation exceeds some predetermined time limit.

Memory systems exist which treat erase blocks as independent regions of memory and provide defect tolerance by disregarding erase blocks containing faults. Thus, even if an erase block had only one defective cell the whole erase block would be disregarded. This arrangement is highly inefficient for FLASH memory architectures which use large erase blocks. This is because the arrangement only provides coarse-grained fault tolerance which does not make efficient use of available areas of functional memory within the circuit.

SUMMARY OF THE INVENTION

Thus the present invention provides a fault tolerant memory system comprising: an array of storage locations, where the array is erasable in blocks of storage locations and each block of storage locations is sub-divided into a plurality of groups of storage locations control information storage means for storing defect information for each group in each block, address counter means for addressing the groups in the particular erase block being erased, evaluation means for determining whether the defect information stored in the control information storage means for the particular group currently addressed by the address counter means indicates that the particular group contains one or more defective storage locations and incrementing means responsive to the evaluation means to increment the address counter when the current address in the address counter means addresses a group containing one or more defective locations.

BRIEF DESCRIPTION OF THE DRAWINGS

For a better understanding of the present invention and to show how the same may be carried into effect reference will now be made, by way of example to the accompanying drawings in which:

FIG. 1 shows a FLASH memory system 10 with a plurality of erase blocks 12.

DETAILED DESCRIPTION OF THE INVENTION

Figure 1:
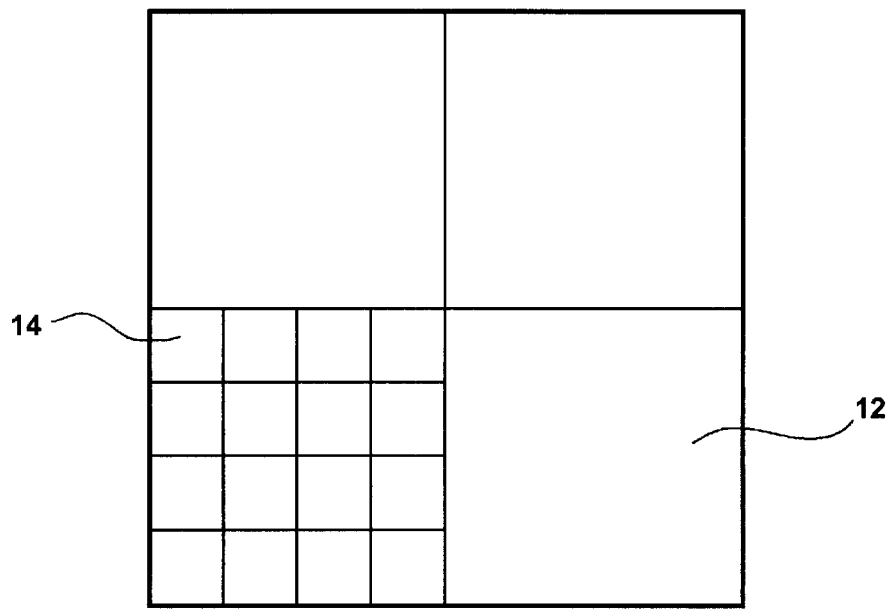
FIG. 1 shows a FLASH memory system with erase blocks subdivided into smaller blocks called fundamental blocks.

Each erase block 12 is composed of a plurality of fundamental blocks 14. A fundamental block 14 is represented in FIG. 1 as a rectangular block of cells, although the fundamental block 14 may only exist within the physical address space of the FLASH circuit and not as an element of the FLASH memory array physical structure.

Each fundamental block 14 is defined by a set of sequential physical addresses to the memory system. Since memory circuits use address scrambling (sequential logical addresses do not yield adjacent physical memory locations) address scrambling may need to be employed to achieve sequential addressing within a fundamental block 14. Address scrambling is a function of the FLASH circuit physical design.

In this embodiment of the present invention faults within the FLASH memory array are mapped to a resolution of one fundamental block 14. The memory system may then allow all locations in non-defective fundamental blocks 14 to be incorporated in the system's address space.

Figure 2:
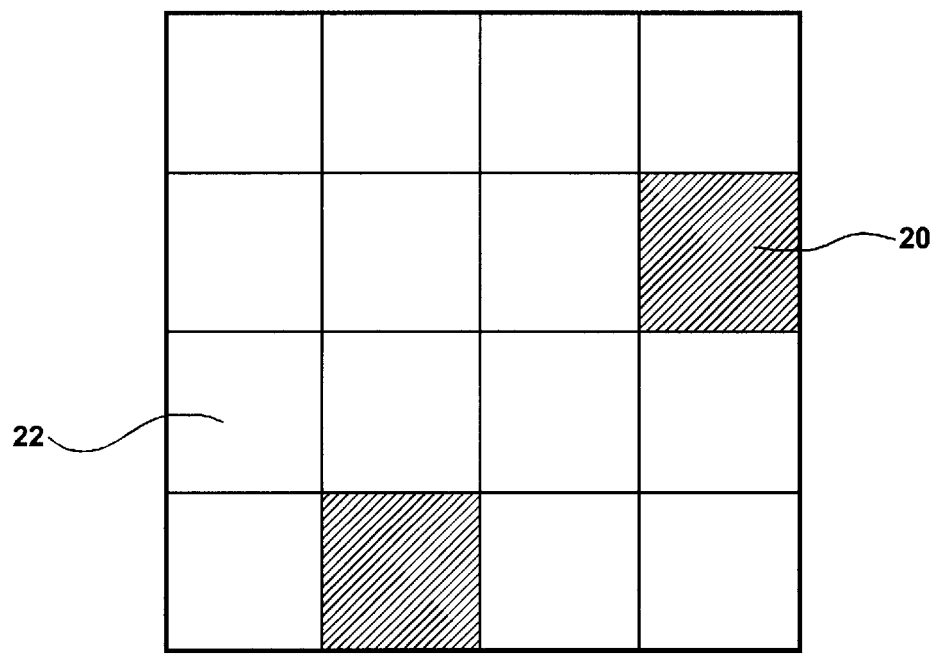
FIG. 2 shows a FLASH memory system composed of perfect erase blocks and partially working erase blocks.

The FLASH memory circuit is therefore composed of a combination of partially working erase blocks 20 and perfect erase blocks 22, as shown in FIG. 2. Erasure of perfect erase blocks 22 can be performed in the usual manner under full control of the internal state machine. However, the presence of defects in a partially working erase block precludes the use of the usual erasure operation. Normal verification of successful erasure is not possible when the block contains hard faults which may prevent an erased state being read.

In one embodiment of the present invention correct erasure of partially working erase blocks 20 can be achieved by modification of the verification circuitry within the FLASH memory device. The verification circuitry performs the verification of full erasure of each cell in the block.

A register or set of registers is introduced into which a defect map of the erase block is loaded via the command interface prior to the initiation of the erase operation. In another embodiment the defect map for all erase blocks 12 in the circuit is permanently stored in a small non-volatile memory within the circuit.

The defect map will normally have one bit allocated for each fundamental block 14 within the erase block. A bit will be set when its corresponding fundamental block 14 is defective.

The process of verifying the erasure of bits within the fundamental block 14 after application of an erase pulse makes use of margined reference signals to guarantee correct read operation as described above. Margined reference signals ensure that current conduction in a cell during an access immediately after erasure is sufficiently offset from the value defining the threshold between the logic one and logic zero state.

The defect map is used, however, to ensure that the address counter, which defines the memory location to be verified, skips the addresses of erase blocks 12 containing defects. A group of bits from the address counter, which are sufficient to define the identity of the fundamental block 14 being addressed, are decoded to select the bit from the defect map corresponding to the addressed fundamental block 14. If the defect map bit defines the fundamental block 14 as defective, the address counter is incremented to the first location of the next fundamental block 14.

With this modification to the sequencing of the address counter, the standard process for erasure of an erase block may be applied to a fundamental block 14 containing defects. This technique requires modification to the internal design of the FLASH circuit. In another embodiment of the present invention, no modification to the internal design of the FLASH circuit is required. Erasure of partially working erase blocks 20 is achieved by the introduction of external circuitry to eliminate the need for erasure of fundamental blocks 14 which contain defects. This technique allows standard components with partially working erase blocks 20 to be used in a memory system.

A register or set of registers into which a defect map of the erase block is loaded prior to the initiation of the erase operation is incorporated in the external control circuitry. The defect map will normally have one bit allocated for each fundamental block 14 within the erase block. A bit will be set when its corresponding fundamental block 14 is defective. A perfect erase block can be identified from the defect map for the block, and the normal erase sequence under full internal state machine control can be implemented.

When the defect map indicates a partially working erase block, an external controller executes the following sequence of commands to the FLASH memory device. The erase operation is initiated in the normal way via the command interface. However, the internal state machine is only allowed to control the erase operation for a fixed time T. At the end of this time T, the erase operation is terminated or suspended to allow the state of the locations within the erase block to be determined. The state of the locations within the erase block being erased is determined by means of a conventional read operation to address locations in the erase block. If the FLASH circuit design allows an erase block to be read during a suspended erase operation then an erase suspend command at the command interface may be used at the end of fixed time T. If, however, the FLASH circuit design does not allow the storage locations to be read during a suspended erase operation (that is if an erase operation must be terminated before storage locations within the erase block being erased may be read), then this is initiated at the end of the fixed time T by means of a hardware reset signal which is provided on FLASH memory devices to allow correct initialisation.

The contents of all non-defective fundamental blocks 14 are read and a log is constructed indicating whether each non-defective fundamental block 14 has had successful erasure of all of its storage locations.

In the same manner as for the internally controlled technique described above, the defect map is used to ensure that the external address counter which defines the memory location to be read skips the addresses of fundamental blocks 14 containing defects. A group of bits from the address counter which are sufficient to define the identity of the erase block being addressed are decoded to select the bit from the defect map corresponding to the addressed fundamental block 14. If the defect map bit defines the fundamental block 14 as defective the address counter is incremented to the first location of the next fundamental block 14.

If the log shows that any fundamental block 14 which is indicated as good in the defect map fails to erase fully within time T, then the defect map is amended to mark the block as defective for all future erase and data storage operations.

The defect map for the erase block is first determined during manufacturing test of the FLASH memory component. A fundamental block 14 is defined as good only if it is capable of successful erasure within the fixed time T. A guard band (time tG) may be applied to the time T for manufacturing test to ensure an adequate margin for normal operation. That is, when a guard band is being used, successful erasure must occur in time (T-tG) to ensure an adequate margin.

This method of using a conventional read operation to verify correct erasure of an erase block does not make use of margined internal voltage and current reference signals to guarantee correct subsequent read operation. However, the following alternative method of providing a suitable margin between erase verification and subsequent read operation may be employed. Once erasure of an erase block has been verified after time T a further period of erasure of duration t is implemented to reduce the charge level further. If the initial erase operation was suspended at time T, the additional erase period t may be implemented by resumption of the erase operation. If the initial erase operation was terminated at time T, a new erase operation of duration T+t is initiated. In this latter case, correct erasure after a period T+t may be verified by reading the contents of all nondefective fundamental blocks 14. This process for erasure of an erase block may be applied to an erase block containing defects. The technique requires no modification to the design of the FLASH circuit and may be implemented with external control to a standard FLASH memory component.

It will be appreciated that various modifications may be made to the above described embodiments, within the scope of the present invention.

What is claimed is:

1. A memory system for a digital computer comprising an array of elementary, potentially faulty storage elements, characterised in that said storage elements are arranged in blocks (12) for the purpose of erasure, each block being subdivided into a plurality of groups (14) of storage elements, and that said memory system includes control information storage means for storing defect information for each group in each block, address storage means for addressing the groups in a block selected for erasure, testing means for determining whether the defect information stored in the control information storage means for a particular group of said selected block currently addressed by the address storage means indicates that the said particular group contains at least one defective storage locations, and address changing means responsive to the testing means to change the contents of the address storage means when a current address in the address storage means is that of a group containing at least one defective locations.

2. A fault tolerant memory system according to claim 1, characterised in that the control information storage means is at least one.

3. A fault tolerant memory system according to claim 1, characterised in that the control information storage means is non-volatile memory.

4. A fault tolerant memory system according to claim 1, characterised in that the control information storage means stores one bit for each group in each block.

5. A fault tolerant memory system according to claim 1, characterised in that the control information storage means contains a block defect indicator which is set when the selected block contains any defective storage locations.

6. A fault tolerant memory system according to claim 5, characterised in that an erase cycle is performed on any block which has an unset block defect indicator in the control information storage means.

7. A fault tolerant memory system according to claim 5, characterised in that when the block defect indicator is set a modified erase cycle is performed.

8. A fault tolerant memory system according to claim 7, characterised in that modified erase cycle comprises an erase cycle, followed by a verify cycle, then a further erase cycle.

9. A fault tolerant memory system according to claim 7, characterised in that if a group fails the modified erase cycle then defect information in the control information storage means for the group that failed the modified erase cycle is updated.

* * * * *

UNITED STATES PATENT AND TRADEMARK OFFICE
CERTIFICATE OF CORRECTION

PATENT NO. : 6,345,367 B1
DATED : February 5, 2002
INVENTOR(S) : Alan Welsh Sinclair It is certified that error appears in the above-identified patent and that said Letters Patent is hereby corrected as shown below:

<u>Title page,</u>
Item [73], Assignee, replace "Memory Coroporation PLC" with -- Memquest, Inc. --.

<u>Column 1,</u>
Line 12, after "PRIOR" insert -- ART --.
Line 35, after "over-erasure" insert -- , --.

<u>Column 2,</u>
Line 17, after "storage locations" insert -- , --.
Line 25, after "Storage locations" insert -- , --.
Line 34, after "example" insert -- , --.

<u>Column 3,</u>
Line 7, after "present invention" insert -- , --.

<u>Column 4,</u>
Line 10, after "that is" insert -- , --.

<u>Column 5,</u>
Line 22, after "one" insert -- register --

<u>Column 6,</u>
Line 16, insert -- the -- before "memory"

Signed and Sealed this

Twenty-ninth Day of October, 2002

*Attest:*

*Attesting Officer*

JAMES E. ROGAN
*Director of the United States Patent and Trademark Office*